(12) United States Patent
Steeneken

(10) Patent No.: US 9,431,177 B2
(45) Date of Patent: *Aug. 30, 2016

(54) INTERFACE FOR COMMUNICATION BETWEEN VOLTAGE DOMAINS

(71) Applicant: NXP B.V., Eindhoven (NL)

(72) Inventor: Peter Gerard Steeneken, Valkenswaard (NL)

(73) Assignee: NXP B.V., Eindhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 14/657,978

(22) Filed: Mar. 13, 2015

(65) Prior Publication Data

US 2015/0187503 A1    Jul. 2, 2015

Related U.S. Application Data

(63) Continuation of application No. 13/478,737, filed on May 23, 2012, now Pat. No. 9,007,141.

(51) Int. Cl.
*H01G 4/38* (2006.01)
*H01P 1/04* (2006.01)
*H01L 23/48* (2006.01)
(Continued)

(52) U.S. Cl.
CPC ............... *H01G 4/385* (2013.01); *H01G 4/06* (2013.01); *H01L 23/48* (2013.01); *H01L 23/642* (2013.01); *H01L 28/60* (2013.01); *H01P 1/04* (2013.01); *H03H 7/004* (2013.01); *H04B 5/0012* (2013.01); *H01L 25/0655* (2013.01); *H01L 2224/48137* (2013.01); *H01L 2924/00014* (2013.01)

(58) Field of Classification Search
CPC .......... H04B 5/0012; H04B 3/56; H01P 1/04; H01G 4/40; H01L 23/48; H01L 23/642
USPC ................................ 333/24 C, 109, 116, 238
See application file for complete search history.

(56) References Cited

U.S. PATENT DOCUMENTS 3,273,033 A    9/1966 Rossmeisl
3,512,110 A    5/1970 Clar
(Continued)

FOREIGN PATENT DOCUMENTS

CN    1551656 A    1/2004
CN    101006384 A    7/2007
(Continued)

OTHER PUBLICATIONS

Greg Smith, "Hybrid Isolation Amps Zap Price and Voltage Barriers" Electronic Design, Dec. 11, 1986, pp. 91?
(Continued)

*Primary Examiner* — Dean Takaoka
*Assistant Examiner* — Alan Wong

(57) ABSTRACT

In one or more embodiments, circuitry is provided for isolation and communication of signals between circuits operating in different voltage domains using capacitive coupling. The capacitive coupling is provided by one or more capacitive structures having a breakdown voltage that is defined by way of the various components and their spacing. The capacitive structures each include three capacitive plates arranged to have two plates located in an upper layer and one plate located in a lower layer. A communication signal can be transmitted via the capacitive coupling created between the lower plate and each of the upper plates, respectively.

20 Claims, 7 Drawing Sheets

(51) Int. Cl.
  *H01L 49/02* (2006.01)
  *H01L 23/64* (2006.01)
  *H04B 5/00* (2006.01)
  *H01G 4/06* (2006.01)
  *H03H 7/00* (2006.01)
  *H01L 25/065* (2006.01)

(56) References Cited

U.S. PATENT DOCUMENTS

| | | | |
|---|---|---|---|
| 4,292,595 A | 9/1981 | Smith | |
| 4,748,419 A | 5/1988 | Somerville | |
| 4,809,356 A | 2/1989 | Peckham et al. | |
| 5,008,639 A * | 4/1991 | Pavio | H01P 5/187 333/116 |
| 5,138,436 A | 8/1992 | Koepf | |
| 5,187,636 A | 2/1993 | Nakao | |
| 5,187,637 A | 2/1993 | Embree | |
| 5,321,597 A | 6/1994 | Alacoque | |
| 5,786,979 A | 7/1998 | Douglass | |
| 6,023,408 A * | 2/2000 | Schaper | H01G 4/35 361/306.2 |
| 6,271,131 B1 | 8/2001 | Uhlenbrock et al. | |
| 6,331,999 B1 | 12/2001 | Ducaroir et al. | |
| 6,347,395 B1 | 2/2002 | Payne et al. | |
| 6,429,735 B1 | 8/2002 | Kuo et al. | |
| 6,507,226 B2 | 1/2003 | Swonger et al. | |
| 6,636,166 B2 | 10/2003 | Sessions et al. | |
| 6,664,859 B1 | 12/2003 | Chen et al. | |
| 6,809,569 B2 | 10/2004 | Wang et al. | |
| 6,839,862 B2 | 1/2005 | Evoy et al. | |
| 6,859,883 B2 | 2/2005 | Svestka et al. | |
| 6,882,046 B2 | 4/2005 | Davenport et al. | |
| 6,885,259 B2 | 4/2005 | Lee et al. | |
| 6,920,576 B2 | 7/2005 | Ehmann | |
| 6,992,377 B2 | 1/2006 | Zhou et al. | |
| 7,199,617 B1 | 4/2007 | Schrom et al. | |
| 7,302,247 B2 | 11/2007 | Dupuis | |
| 7,312,514 B2 * | 12/2007 | Miyamoto | C01G 29/006 257/532 |
| 7,376,212 B2 | 5/2008 | Dupuis | |
| 7,400,173 B1 | 7/2008 | Kwang et al. | |
| 7,411,421 B1 | 8/2008 | Steinke et al. | |
| 7,421,028 B2 | 9/2008 | Dupuis | |
| 7,447,492 B2 | 11/2008 | Dupuis | |
| 7,460,604 B2 | 12/2008 | Dupuis | |
| 7,463,105 B2 | 12/2008 | Morita et al. | |
| 7,466,213 B2 | 12/2008 | Lobi et al. | |
| 7,577,223 B2 | 8/2009 | Alfano et al. | |
| 7,635,617 B2 * | 12/2009 | Yamazaki | H01L 21/76254 257/E21.561 |
| 7,650,130 B2 | 1/2010 | Dupuis | |
| 7,732,889 B2 | 6/2010 | Crawley et al. | |
| 7,737,871 B2 | 6/2010 | Leung et al. | |
| 7,738,568 B2 | 6/2010 | Alfano et al. | |
| 7,755,400 B2 | 7/2010 | Jordanger et al. | |
| 7,821,428 B2 | 10/2010 | Leung et al. | |
| 7,856,219 B2 | 12/2010 | Dupuis | |
| 7,902,627 B2 | 3/2011 | Dong et al. | |
| 8,049,573 B2 | 11/2011 | Alfano et al. | |
| 8,064,872 B2 | 11/2011 | Dupuis | |
| 8,169,108 B2 | 5/2012 | Dupuis | |
| 8,198,951 B2 | 6/2012 | Dong et al. | |
| 8,659,149 B2 * | 2/2014 | French | H01L 23/147 257/725 |
| 8,674,486 B2 * | 3/2014 | Haigh | H01L 23/49503 257/676 |
| 8,902,016 B2 | 12/2014 | Pagani | |
| 8,921,988 B2 * | 12/2014 | Hsu | H01L 23/5223 257/500 |
| 9,007,141 B2 * | 4/2015 | Steeneken | H01L 28/60 307/109 |
| 2001/0052623 A1 | 12/2001 | Kameyama et al. | |
| 2002/0021144 A1 | 2/2002 | Morgan et al. | |
| 2002/0184544 A1 | 12/2002 | Svestka et al. | |
| 2002/0186058 A1 | 12/2002 | Prodanov | |
| 2003/0214346 A1 | 11/2003 | Pelliconi | |
| 2004/0076192 A1 | 4/2004 | Zerbe et al. | |
| 2004/0159893 A1 | 8/2004 | Kitahara | |
| 2004/0161068 A1 | 8/2004 | Zerbe et al. | |
| 2005/0127452 A1 | 6/2005 | Rippke et al. | |
| 2005/0174156 A1 | 8/2005 | Wu et al. | |
| 2005/0201025 A1 | 9/2005 | Shau | |
| 2006/0138595 A1 | 6/2006 | Kiyotoshi | |
| 2007/0075784 A1 | 4/2007 | Pettersson et al. | |
| 2007/0097562 A1 | 5/2007 | Shinoda | |
| 2008/0174360 A1 | 7/2008 | Hsu | |
| 2008/0272703 A1 | 11/2008 | Chan et al. | |
| 2008/0290444 A1 | 11/2008 | Crawley et al. | |
| 2009/0027328 A1 | 1/2009 | Johnson et al. | |
| 2009/0146760 A1 | 6/2009 | Reefman et al. | |
| 2009/0213914 A1 | 8/2009 | Dong et al. | |
| 2009/0237858 A1 | 9/2009 | Steeneken et al. | |
| 2010/0052826 A1 | 3/2010 | Callahan et al. | |
| 2010/0118918 A1 | 5/2010 | Dupuis | |
| 2010/0327940 A1 | 12/2010 | Eisenstadt et al. | |
| 2011/0006814 A1 | 1/2011 | Acar et al. | |

FOREIGN PATENT DOCUMENTS

| | | |
|---|---|---|
| CN | 101118924 A | 2/2008 |
| CN | 101877683 A | 11/2010 |
| EP | 1 291 918 A2 | 12/2003 |
| EP | 1 564 884 A1 | 8/2005 |
| GB | 2 204 467 A | 11/1988 |

OTHER PUBLICATIONS

Wally Meinel, et al., "Hermetic Analog Isolation Amplifier", Proceedings of the 1987 International Symposium on Microelectronics, Minneapolis, Sep. 1987.

Burr Brown, Noise Sources in Applications Using Capacitive Coupled Isolated Amplifiers, Application Bulletin, Burr Brown Corporation, 1993.

Burr Brown, Hybrid Isolation Amps Zap Price and Voltage Barriers, Application Bulletin, Burr Brown Corporation, 1994.

Burr Brown, An error analysis of the ISO1 02 in a small signal measuring application, Application Bulletin, Burr Brown Corporation, 1994.

Burr Brown, ISO 102, ISO 106 Signal Isolation Buffer Amplifiers, Datasheet, Burr Brown Corporation, 1995.

J. Basilio Simoes, et al., "The Optical Coupling of Analog Signals" IEEE Transaction on Nuclear Science, vol. 43, No. 3, Jun. 1996, pp. 1672-1674.

Stephen L. Diamond, "IEEE 1394: Status and growth path", IEEE Micro, Jun. 1996, pp. 75-78.

Thaddeus J. Gabara, et al., "Capacitive coupling and quantized feedback applied to conventional CMOS technology" IEEE Journal of Solid-Slate Circuits, vol. 32, No. 3, Mar. 1997.

Adrian Paskins, The IEEE 1394 BUS, The Institution of Electrical Engineers Conference, May 12, 1997.

Richard Crisp. "Direct Rambus Technology: The New Main Memory Standard" IEEE Micro, Nov./Dec. 1997, pp. 18-28.

Thomas Nilsson, "A distributed combined heat and power plant control unit", Master Thesis, Linkoping Institute of Technology, Dec. 16, 1997.

Scott Wayne, "Finding the Needle in a Haystack: Measuring Small differential voltages in the presence of large-common mode voltages", Analog Dialogue, 34-1, 2000, pp. 1-4.

Infineon Technologies, IV AX Integrated Voice & ADSL Transceiver, PEB35512, PEB55508, PEB3558, PEB4565, PEB4566, Datasheet, Infineon Technologies AG, 2001.

William B. Kuhn, et al., "An RF-based IEEE 1394 Ground Isolator designed in silicon-on-insulator process" Circuits and Systems, 2001. MWSCAS 2001. Proceedings of the 44th IEEE 2001 Midwest Symposium on, vol. 2, Aug. 14-17, 2001.

Scott Irwin, XILINX, "Usage Models for multi-gigabit serial transceivers", WP157, V.1.0, Mar. 15, 2002.

PhyCORE-MCF548x Hardware Manual, PHYTEC Technology Holding Company, Jan. 2005.

(56) References Cited

OTHER PUBLICATIONS

LANTRONIX, Xpress-DR+Wireless, Datasheet, LANTRONIX, 2006.
Eugenio Culurciello, et al., "Capacitive inter-chip data and power transfer for 3-D VLSI" IEEE Trans. Circuits Syst. II, val. 53, No. 12, pp. 1348-1352, 2006.
Geoffrey Marcus, et al., "A Monolithic Isolation Amplifier in silicon-on-isolator CMOS: Testing and Applications", Analog Integr. Circ. Sig. Process, Jun. 27, 2006.
Inoue, A., et al "A high efficiency, high voltage, balanced cascade FET", IEEE International Microwave Symposium, Jun. 1995.
S. M. Sze, "Semiconductor Devices Physics and Technology", 2nd Edition, John Wiley and Sons, Inc., pp. 493-494 and 503-507, 1985, 2002.
Burr Brown, ISO 103, Low Cost, Internally Powered Isolation Amplifier, IC Publication Datasheet, Burr Brown Corporation, 1989.
Stephen Mick, et al., "Packaging Technology for AC Coupled Interconnection", IEEE Flip-Chip Conference, 2002.
Abed in pourS., Bakkoglu B., with Integrated Output Filter in 0.18 m SiGe Process", IEEE Kiaei S.," A Multistage Interleaved Synchronous Buck Converter Transactions on Power Electronics, vol. 22, No. 6, Nov. 2007.
Aoki I., Kee S., Magoon R., Aparicio R., Bohn F., Zachan J., Hatcher G., McClymont D., Hajimiri A., "A Fully Integrated Quad-Band GSM/GPRS CMOS Power Amplifier", International Solid-State Circuits Conference, 2007.
Kursun V., Narendra S.G., De V.K., Friedman E.G., "High input voltage step-down DC-DC converters for integration in a low voltage CMOS process", Quality Electronic Design, 2004.
Rocha J., Santos M., Dores Costa J.M., Lima F., "High Voltage Tolerant Level Shifters and DCVSL in Standard Low Voltage CMOS Technologies", IEEE, 2007.
Sonsky J., Heringa A., Perez-Gonzalez J., Benson J., Chiang P.Y., Bardy S., Volokhine I."Innovative High Voltage transistors for complex HV/RF SoCs in baseline CMOS", IEEE, 2008.
Extended European search report in European Patent Appln. No. 13163170.7, 7 pgs. (Jul. 10, 2013).

\* cited by examiner

INTERFACE FOR COMMUNICATION BETWEEN VOLTAGE DOMAINS

CROSS REFERENCE TO RELATED APPLICATIONS

This application is a continuation of copending U.S. patent application Ser. No. 13/478,737 filed on May 23, 2012, the contents of which are incorporated by reference herein.

BACKGROUND

Aspects of the present disclosure relate to apparatuses, devices, and methods involving capacitive isolation.

Aspects of the present disclosure relate to the transmission of data between circuits that operate in different voltage domains. For example, circuits may be galvanically isolated using capacitive coupling on signal paths between the circuits. As a result of such isolation, the circuits operate in separate voltage domains that are not referenced to one another by a common ground voltage level. As such, large voltage differences may arise between the corresponding voltage domains. Galvanic isolation has been used for a variety of different applications. For instance, galvanic isolation can be provided between multiple integrated circuit chips, which can be located within the same package or in different packages. Signals can be passed between the integrated circuits using galvanic isolation techniques.

One method of galvanic isolation uses capacitors on signal paths between two circuits as a means of blocking DC voltages and attenuating low-frequency signals while transmitting high-frequency signals. Due to large voltage differences that may arise between isolated voltage domains for some applications, capacitors having high breakdown voltage may be required. However, physical space constraints may make it difficult to implement capacitors having the required breakdown voltage. For example, a parallel plate capacitor may be implemented alongside other circuitry in an integrated circuit (IC) using conventional processes (e.g., CMOS, complementary metal-oxide-semiconductor). Two capacitive plates are implemented in different metallization layers of the IC and are separated by a dielectric layer. The breakdown voltage of the parallel plate capacitor is dependent on the thickness of the dielectric layer. For higher voltage applications, the thickness of the dielectric layer is increased to provide a higher breakdown voltage. However, in certain CMOS processes, the maximum dielectric thickness that can be implemented is limited to about 5-10 um. For some applications, this thickness is not sufficient to guarantee sufficient breakdown voltage.

Aspects of the present disclosure relate to the transmission of data between circuits that are isolated from one another. For example, circuits may be galvanically isolated using capacitive coupling on signal paths between the circuits. As a result of such isolation, the circuits operate in separate voltage domains that are not referenced to one another by a common ground voltage level. As such, voltage differences may arise between the corresponding voltage domains. In certain instances, the voltage differences can be relatively large in comparison to the voltages within each of the separate voltage domains.

SUMMARY

In one or more embodiments, circuitry is provided for isolation and communication of signals between circuits operating in different voltage domains using capacitive coupling. The embodiments utilize capacitive structures that can be useful for providing high breakdown voltages. The capacitive structures include three capacitive plates arranged to have two plates located in an upper layer and one plate located in a lower layer. In operation, the capacitive structure functions as two capacitors coupled in series (e.g., an input plate and an intermediate plate forming a capacitor and the plate and the output plate for another capacitor). This configuration can be particularly useful for providing a high overall breakdown voltage of the structure.

Embodiments of the present disclosure are directed toward an isolation circuit having a first capacitive structure in a first voltage domain. The first capacitive structure can include a first conducting substrate that is electrically connected to a reference voltage of the first voltage domain, such as ground. For instance, the substrate may also have active CMOS components (e.g., transistors) that require that conductive substrate to be connected to ground. The input and intermediate capacitive plates function as a first capacitor. The intermediate and output capacitive plates function as a second capacitor arranged in series with the first capacitor. A first dielectric layer defines/provides a first breakdown voltage by way of the physical separation between the intermediate capacitor plate and each of the input and output capacitor plates. The intermediate capacitor plate can be located below each of the input and output capacitor plates (e.g., in a lower stack layer). A second dielectric layer is configured and arranged to provide substantially the same breakdown voltage as the first breakdown voltage. This is accomplished by setting the distance of the physical separation provided between the conducting substrate and the first intermediate capacitor plate accordingly. Although the two dielectric layers can be part of the same dielectric stack, they are referred to as different layers due to the stacked relationship between the respective plates and/or conductive substrate. The above arrangement of plates can then be repeated for a second capacitive structure in a second voltage domain, which is then arranged in series with the first capacitive structure.

In some embodiments, the capacitive structures may be implemented on a substrate having various portions connected to one or more reference voltages (e.g., ground voltages). Each capacitive structure includes a first dielectric layer separating the input and output capacitive plates from the intermediate capacitive plate. Each capacitive structure also includes a second dielectric layer separating the intermediate capacitive plate the substrate. The first and second dielectric layers have thicknesses such that a first breakdown voltage between the capacitive plates is approximately equal to a second breakdown voltage between the lower capacitive plate and the reference voltage tied to the substrate. In some embodiments, the capacitive structures may be implemented on a silicon-on-insulator (SOI) substrate, in which a silicon layer is separated from a silicon handle wafer by an insulating oxide layer. The capacitive structures are arranged such that both the second dielectric layer and the buried oxide provide isolation between the intermediate lower capacitive plate and the substrate. Use of the buried oxide layer of the SOI substrate in this manner provides allows the thickness of the first dielectric layer to be increased compared to a standard silicon wafer substrate. As a result, the breakdown voltage between the capacitive plates is increased.

In one or more embodiments, a method of communication between first and second voltage domains is provided. Communication signals are transmitted from a transmitter circuit located in a first voltage domain on a first substrate. Capacitive isolation is provided for the communication signals between the first voltage domain and a second voltage domain by communicating the transmitted communication signals through an isolation circuit. The isolation circuit includes a first capacitive structure located on the first substrate to provide the communication signal from the first voltage domain to an unreferenced voltage domain. The isolation circuit includes a second capacitive structure located on a second substrate that is used to provide the communication signals from the unreferenced voltage domain to a second voltage domain. A receiver circuit is located on the second substrate and is configured to receive the communication signals at an input in the second voltage domain from the second capacitive structure.

Consistent with certain embodiments, a device includes a transmitter circuit that is in a first voltage domain and that is configured and arranged to transmit communication signals. A receiver circuit is located in a second voltage domain and has an input that is configured and arranged to receive the communication signals in the second voltage domain. An isolation circuit is configured and arranged to provide capacitive isolation for the communication signals between the first and second voltage domains. The isolation circuit includes a first and second capacitive structure. The first capacitive structure is located on a first substrate in a first voltage domain. The first capacitive structure includes a first/input capacitive plate configured and arranged to receive the communication signals from the transmitter circuit and in the first voltage domain. A second/intermediate capacitive plate is configured and arranged to receive the communication signals from the first capacitive plate at a first floating node of the isolation circuit. A third/output capacitive plate is configured and arranged to receive the communication signals from the second capacitive plate at a second floating node of the isolation circuit. A first dielectric layer is configured and arranged to provide first breakdown voltages of the first capacitive structure by providing an electrical and physical separation between the second capacitive plate and each of the first and third capacitive plates, the physical separation having a first distance. A second dielectric layer provides an electrical and physical separation between the first substrate and the second capacitive plate to provide substantially the same breakdown voltages as the first breakdown voltages.

The second capacitive structure is located on a second substrate in a second voltage domain. This second capacitive structure includes a fourth (input) capacitive plate configured and arranged to receive the communication signals from the third capacitive plate at a third floating node of the isolation circuit. A fifth (intermediate) capacitive plate is configured and arranged to receive the communication signals from the fourth capacitive plate at a fourth floating node of the isolation circuit. A sixth (output) capacitive plate is configured and arranged to receive the communication signals from the fifth capacitive plate and to provide the communication signals to the input of the receiver. A third dielectric layer defines second breakdown voltages of the second capacitive structure by providing an electrical and physical separation between the fifth capacitive plate and each of the fourth and sixth capacitive plates, the physical separation having a second distance. A fourth dielectric layer provides an electrical and physical separation between the second substrate and the fifth capacitive plate to provide substantially the same breakdown voltages as the second breakdown voltages.

Various embodiments are directed toward methods that include transmitting communication signals from a transmitter circuit located on a first substrate that is in a first voltage domain. Capacitive isolation is provided for the communication signals between the first voltage domain and a second voltage domain by communicating the transmitted communication signals through the isolation circuit by capacitively coupling the communication signals from the first voltage domain to an unreferenced domain using a first capacitive structure located on the first substrate. The isolation circuit can include the first and second isolation structures described in the previous embodiments. The communication signals are then received from the second capacitive structure at an input of a receiver circuit that is in the second voltage domain.

The above summary is not intended to describe each embodiment or every implementation of the present disclosure. The figures, detailed description, and claims that follow more particularly exemplify various embodiments.

BRIEF DESCRIPTION OF THE DRAWINGS

Aspects of the present disclosure may be more completely understood in consideration of the detailed description of various embodiments of the present disclosure that follows in connection with the accompanying drawings, in which.

DETAILED DESCRIPTION

Figure 1:
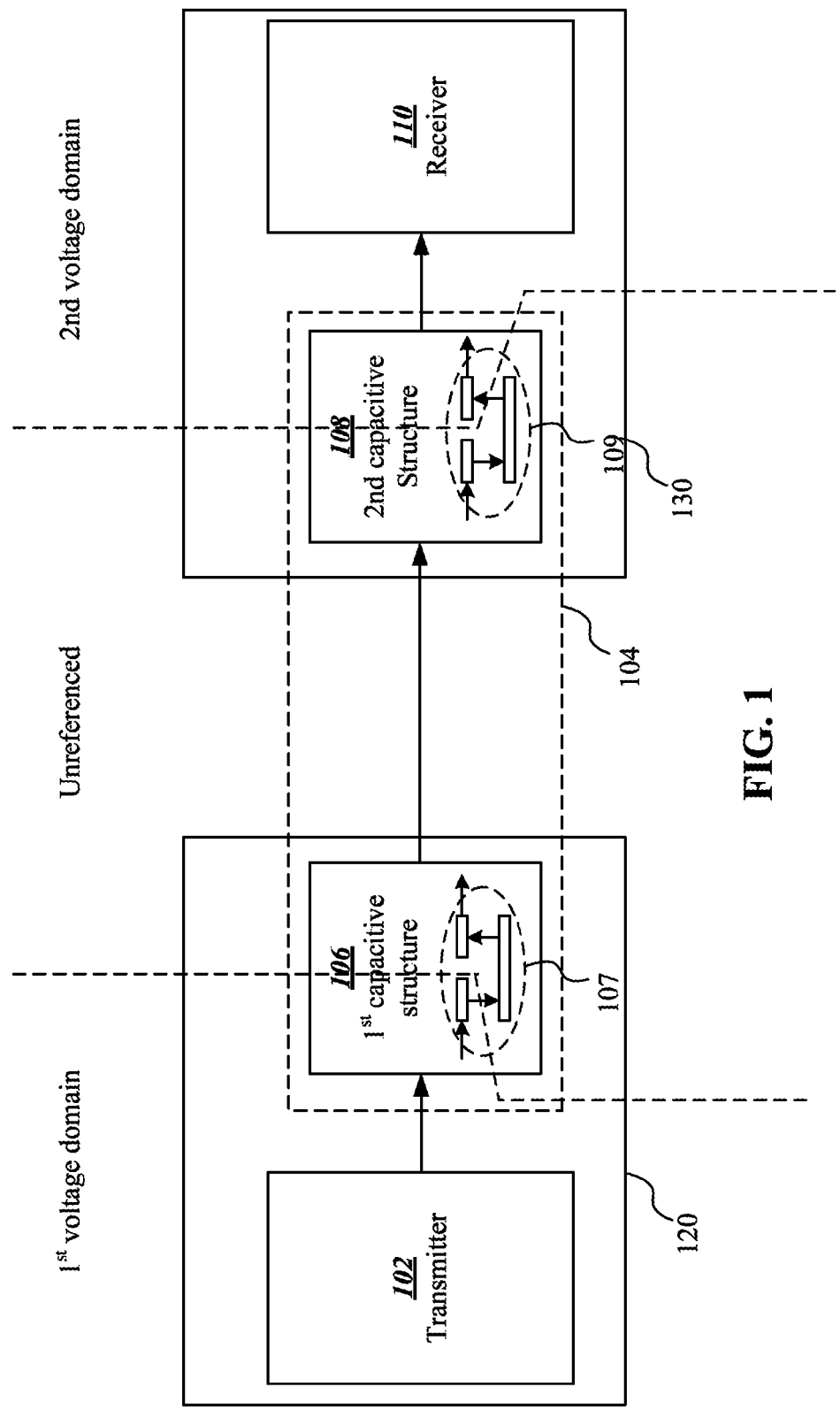
FIG. 1 depicts a block diagram of a system for communicating between two isolated voltage domains, consistent with one or more embodiments of the present disclosure.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims.

Aspects of the present disclosure relate to the transmission of data between circuits that are isolated from one another. For example, circuits may be galvanically isolated using capacitive coupling on signal paths between the circuits. Particular embodiments use parallel plate capacitor structures to provide capacitive coupling.

In one or more embodiments, an isolation circuit is used to provide capacitive coupling for communication between circuits operating in different voltage domains. In some particular embodiments of the present disclosure, the capacitive isolation circuits include three capacitive plates arranged to have two (e.g., input and output) plates located in an upper layer and another (e.g., intermediate) plate located in a lower layer. The arrangement of the capacitive plates creates a capacitive field between the plate in the lower layer and each of the plates in the upper layer, respectively.

In operation, the isolation circuit functions as two capacitors connected together in series. As such, breakdown voltage measured between the two upper plates, is effectively doubled in comparison to a two-plate capacitor having the same the dielectric thickness constraints. However, even where capacitors are connected in series on the same substrate, breakdown voltage can be reduced due to breakdown between one of the capacitive plates and the substrate. This breakdown can be particularly problematic for CMOS applications, where the substrate may be connected to a ground voltage. In some embodiments, thickness of dielectric layers is such that the breakdown voltage between the intermediate (lower) capacitive plate and each of the input/output (upper) capacitive plates is nominally equal to half of the overall breakdown voltage of the capacitive structure (i.e. is nominally equal to the vertical breakdown voltage between the bottom electrode and a grounded substrate). Similarly, to prevent lateral breakdown between the input and output capacitive plates (located in the upper layer), these two plates are separated by a lateral distance such that the lateral breakdown voltage between the input and output plates is nominally equal to the overall breakdown voltage of the capacitive structure (i.e., lateral breakdown is nominally equal to twice the breakdown voltage between either/each of the upper plates and the lower plate, respectively).

In some particular embodiments, the capacitive structure is used to provide galvanic isolation between transmitter and receiver circuits operating in different voltage domains. A first capacitive structure is located in a first voltage domain of the transmitter and a second capacitive structure is located in a second voltage domain of the receiver circuit. Each of the capacitive structures includes three capacitive plates arranged, as described above, to provide a high breakdown voltage.

In a first one of capacitive structures, a first/input capacitive plate is configured to receive the communication signal in the first voltage domain from the transmitter. A second/intermediate capacitive plate is configured as an intermediate node of the capacitive structure and operates at a first floating voltage. A third/output capacitive plate is configured to provide the communication signals to the second capacitive structure in the second voltage domain and operates as a second floating node between the two voltage domains. Accordingly, the input and output capacitor plates share the intermediate capacitor plate and provide the function of two series capacitors. A first dielectric layer separates the intermediate capacitive plate, which is located in a first horizontal layer, from each of the input and output capacitive plates, which are located in a second horizontal layer. A second dielectric layer separates the intermediate capacitive plate from the substrate.

In the second capacitive structure, a fourth capacitive plate (e.g., a second input capacitive plate) is configured to receive the communication signals from the first capacitive structure. The second input capacitive plate operates as a third floating node between the first and second voltage domains. A fifth capacitive plate (e.g., a second intermediate capacitive plate) is configured as a floating node in the second capacitive structure. A sixth capacitive plate (e.g., a second output capacitive plate) is configured to provide the communication signals in the second voltage domain to the input of the receiver circuit. The second input and output capacitor plates share the second intermediate capacitor plate and provide the function of two series capacitors. A third dielectric layer separates the second intermediate capacitive plate located in a third horizontal layer and each of the second input and output capacitive plates, which are located in a fourth horizontal layer. A fourth dielectric layer separates the second intermediate capacitive plate from the substrate.

FIG. 1 shows a system for galvanic isolation between transmitter and receiver circuits operating in different voltage domains. A transmitter circuit 102 operates in a first voltage domain and a receiver circuit 110 operates in a second voltage domain. Isolation circuit 104 provides a communication signal path between the transmitter 102 and receiver 110 while providing galvanic isolation between the two circuits. The isolation circuit 104 includes two capacitive structures 106 and 108.

The isolation circuit 104 is configured to receive data signals from the transmitter 102. The received data signals can be referenced to the first voltage domain (e.g., reference to a ground). The data signals are eventually received at the receiver circuit 110; however, receiver circuit 110 operates in a second voltage domain, (e.g., with reference to a second ground). Intermediate nodes of the isolation circuit, e.g., nodes between circuits 106 and 108, may be floating voltages that are not referenced to the ground voltage of either voltage domain.

Consistent with embodiments of the present disclosure, the capacitive structures of the isolation circuit 104 may be implemented on the same or different substrates of the system. For example, the first capacitive structure 106 may be integrated with the transmitter 102 on a first IC and the second capacitive structure 108 may be integrated with the receiver on a second IC.

The first and second capacitive structures 106 and 108 each include a respective set of three capacitive plates (e.g., 107 and 109), which are arranged to function as two series-connected capacitors. For instance, each capacitive structure can include a set of three capacitive plates: a first/input plate, a second/intermediate plate, and a third/output plate. The input and output plates can each be configured to function as a respective a capacitor with the intermediate plate acting as the other plate of the respective capacitor. In the first capacitive structure 106, one of the capacitive plates of the set 107 is connected to the transmitter 102 in the first voltage domain, and second and third capacitive plates of the set 107 operate as floating nodes in the unreferenced voltage domain. The second capacitive structure 108, also includes a set of three capacitive plates (e.g., fourth, fifth, and sixth capacitive plates) 109 arranged to function as two capacitors connected in series. The fourth and fifth capacitive plates (e.g., second input and intermediate capacitive plates) operate as floating nodes in the unreferenced voltage domain. The sixth capacitive plate (e.g., the second output capacitive plate) of the series connected capacitor arrangement 109 is connected to the receiver 110 in the second voltage domain. The third and fourth capacitive plates are connected by a conductor that provides a current path, e.g., a bondwire between the first and second capacitive structures.

Figure 2:
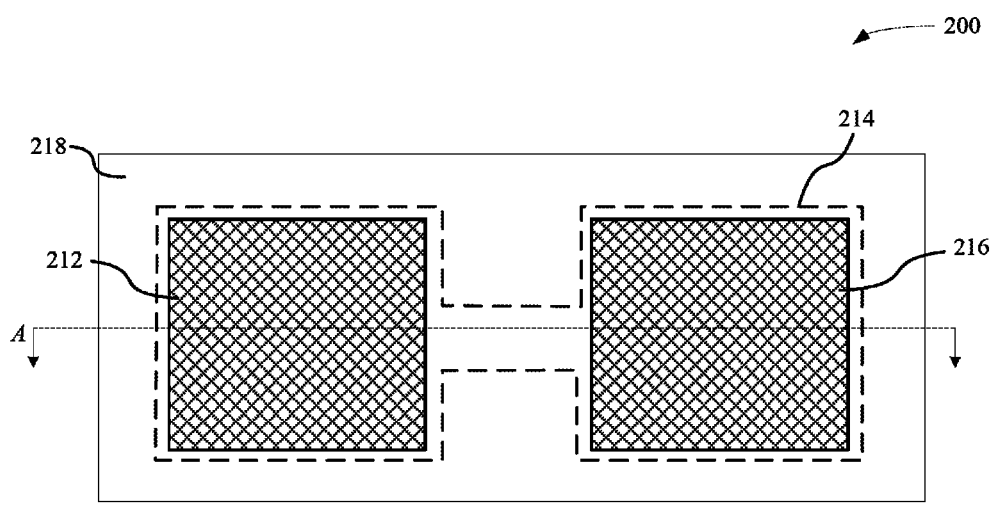
FIG. 2 shows a top view of a high breakdown voltage capacitive structure, consistent with one or more embodiments of the present disclosure.
Figure 3:
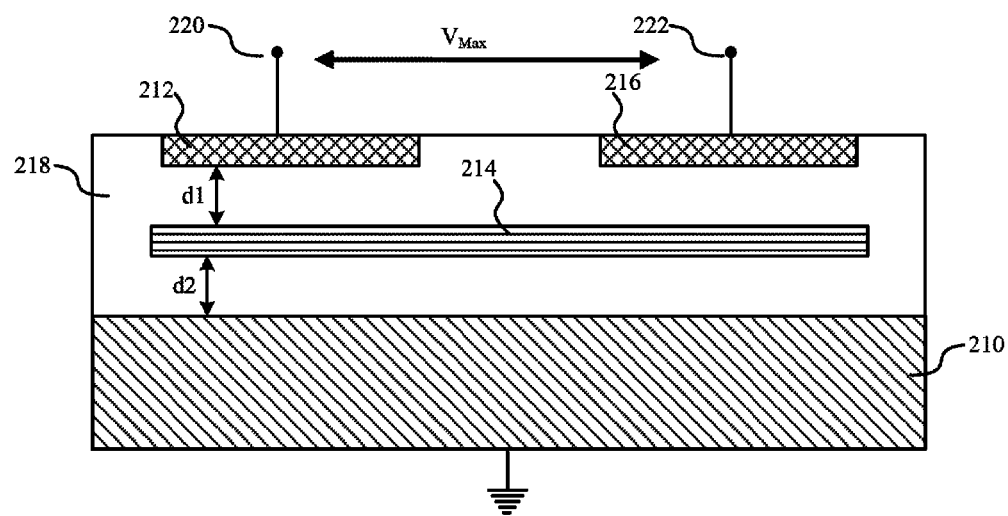
FIG. 3 shows a cross sectional view of the capacitive structure shown in FIG. 2, consistent with one or more embodiments of the present disclosure.

FIGS. 2 and 3 show a capacitive structure formed on a conductive substrate in accordance with one or more embodiments of the present disclosure. FIG. 2 shows a top view of a capacitive structure in accordance with one or more embodiments. In some embodiments, for instance, the capacitive structure 200 may be used, e.g., to implement capacitive structures 106 and 108 in FIG. 1.

FIG. 3 shows a cross section A of the capacitive structure shown in FIG. 2, in accordance with one or more embodiments. The capacitive structure includes three capacitive plates arranged to function as two series coupled capacitors. The capacitive structure includes capacitive plates 212 and 216 (i.e., input and output capacitive plates) located in an upper layer and a capacitive plate 214 (i.e., intermediate capacitive plate) located below capacitive plates 212 and 216 in a lower layer. Capacitive plates 212 and 214 form a first capacitor that is connected in series by plate 214 with a second capacitor formed by capacitive plates 214 and 216. A first layer of dielectric material 218 separates the capacitive plate 214 from each of capacitive plates 212 and 216. Thickness d1 of the dielectric 218 determines the vertical breakdown voltage of the capacitors. The series-coupled arrangement allows overall breakdown voltage (i.e., $V_{Max}$ between 220 and 222) to be double the breakdown voltage typically provided by a typical two plate capacitor having the same thickness d1 of dielectric material.

Embodiments of the present disclosure are directed toward an isolation circuit having a first capacitive structure 200 in a first voltage domain. The first capacitive structure can include a first conducting substrate 210 that is electrically connected to a reference voltage of the first voltage domain, such as ground. For instance, the substrate 210 may also have active CMOS components (e.g., transistors) that require that conductive substrate to be connected to ground. A first dielectric layer, having a thickness d1, defines/provides a breakdown voltage by way of the physical separation between the intermediate capacitor plate 214 and each of the input 212 and output 216 capacitor plates. A second dielectric layer, having a thickness d2, is configured and arranged to provide substantially the same breakdown voltage as the first breakdown voltage. These breakdown voltages can be achieved by setting the distance of the physical separation provided between the conducting substrate 210 and the first intermediate capacitor plate 216 accordingly. For instance, if the first and second dielectric layers have identical breakdown fields $E_{bd} = E1_{bd} = E2_{bd}$, for example because they have the same material composition, this can be accomplished by selecting thickness d1 to be equal to d2. If, however, the first dielectric layer has a breakdown field $E1_{bd}$ and the second dielectric layer has a different breakdown field $E2_{bd}$, this can be accomplished by setting the layer thicknesses such that $d1*E1_{bd} = d2*E2_{bd}$. Although the two dielectric layers can be part of the same dielectric material, they are referred to as different layers due to their respective relationships between the respective plates and/or conductive substrate. The above arrangement of plates can then be repeated for a second capacitive structure in a second voltage domain.

Consistent with embodiments of the present disclosure, capacitive plate 212 has an area $A_1$ and the capacitive plate 216 has an area $A_2$. The voltage (VB) on the lower capacitive plate 214 will be $V_B = (V_{Max}/2)$. There are two conditions in which breakdown may occur. First, breakdown occurs between plates 212 and 214 and/or between 214 and 216 when $$V_{Max} - V_B = V_{Max}/2 > d1*E_{bd}.$$

Second, breakdown occurs between plate 214 and substrate 210 when, $$V_B = V_{Max}/2 > d2*E_{bd}.$$

Dielectric layers thicknesses $d_1$ and $d_2$ are selected to maximize $V_{Max}$ without exceeding the above breakdown limits.

In certain CMOS-based manufacturing processes, the total dielectric stack has a constant thickness (D), where D=d1+d2. The distances d1 and d2 can be varied by choosing different layers in the CMOS backend for capacitive plate 214 (a CMOS backend often has 5 or 6 metal layers at different heights). Under the constraints that D=d1+d2, the distance between substrate 210 and capacitive plate 214 (d2) is given by, $$d2 = D - d1.$$

where $d_2$ is the distance between the substrate 210 and the capacitive plate 214, and $d_1$ is the distance between capacitive plate 214 and capacitive plates 212 and 216.

When the two layers have the same breakdown field Ebd, the overall breakdown voltage ($V_{max}$) of the series capacitor arrangement 200 is then given by:

$$\text{For } d1 \geq d2: V_{max} = D*E_{bd}$$

$$\text{For } d1 < d2: V_{max} = 2*d1*E_{bd} < D*E_{bd}$$

Accordingly, when $d1 \geq d2$, there is a larger overall breakdown voltage than when $d1 < d2$. However, larger dielectric thicknesses d1 can result in a decrease in capacitance. In some particular embodiments, the thicknesses of the first and second dielectric layers are therefore substantially equal (d1=d2). For d1>d2:

$$V_{max} = D*E_{bd}$$

where D=d1+d2 is the total dielectric thickness, $E_{bd}$ is the breakdown field, d1 is the distance between capacitive plate 214 and capacitive plates 212 and 216, and $V1_{bd} = d1*E_{bd}$ is the breakdown voltage of a conventional two-plate capacitor having dielectric thickness d1.

It has been recognized that simply increasing d1 as much as possible is not acceptable for many applications. Rather, a minimum dielectric thickness d2 may be required in order to prevent shorting of the lower capacitive plate and the substrate 210. Therefore the value for d1 can be limited by $d1_{max} = D - d2_{min}$ and the corresponding breakdown voltage for the conventional two-plate capacitor is $V1_{bd} = d1_{max}*E_{bd}$. Such a capacitive structure can exhibit a breakdown voltage that is higher by a factor $D/d1_{max}$ when compared to a corresponding two plate capacitive structure.

Figure 4:
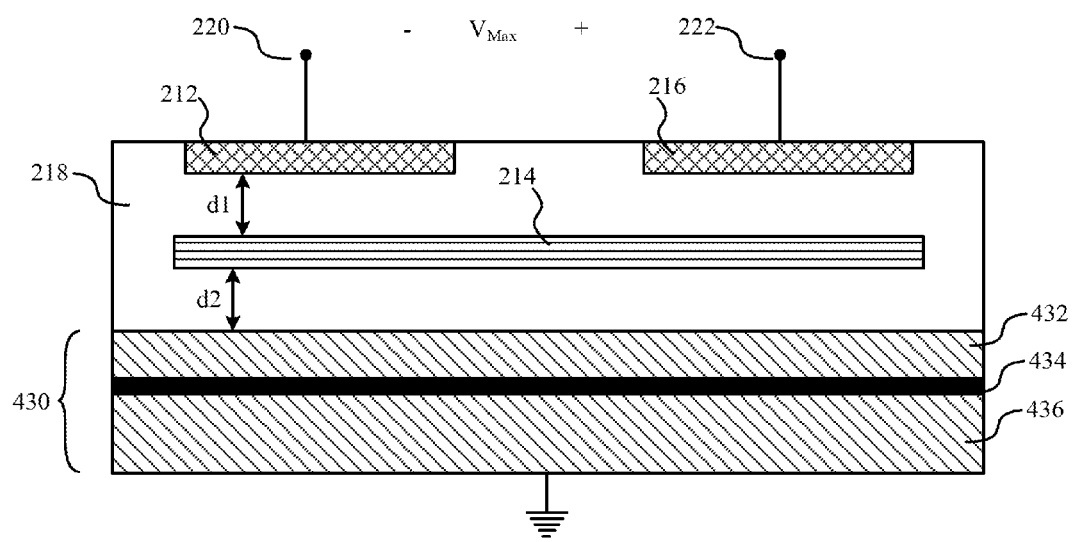
FIG. 4 shows a cross sectional view of the capacitive structure shown in FIG. 2, consistent with one or more embodiments of the present disclosure.

In some embodiments, a capacitive structure is formed on a silicon-on-insulator (SOI) substrate. FIG. 4 shows a cross section A of the capacitive structure shown in FIG. 2 formed on an SOI substrate, in accordance with one or more embodiments. The cross section shown in FIG. 4 is similar to the cross section shown in FIG. 3 in many respects. For ease of explanation, reference numbers of FIG. 3 are used to describe similar aspects. The SOI substrate 430, includes a handle wafer 436, a silicon layer 432, and a buried oxide layer 434 providing isolation between the handle wafer the silicon layer. For example, a buried oxide layer with thickness d_box=1 micrometer may be used to isolate the handle wafer 436 from the 1.5 micron thick silicon layer 432. In such embodiments, the breakdown voltage may be further improved using the buried oxide layer 434 to provide additional isolation between plate 214 and the handle wafer 436, which is tied to a ground voltage. The buried oxide adds to the effective dielectric thickness below plate 214. As a result, $d_2$ can be reduced and $d_1$ increased to further increase the breakdown voltage of the capacitive structure. If the buried oxide has the same breakdown field Ebd as the other layers in 218, the breakdown voltage can be improved with respect to the design in FIG. 3 by a factor (D+d_box)/D.

In some SOI implementations, SOI process may form the dielectric 218 from several different dielectric layers having different dielectric constants and, thus, different breakdown fields. The bottom electrode might be made in the silicon of the SOI or in a conducting layer above it. In this case, the thickness $d_2$ is the sum of the thicknesses of all dielectrics below the lower capacitive plate 214 and $d_1$ is the sum of the thicknesses of all dielectric layers between the lower capacitive plate 214 and the upper capacitive plates 212 and 216. In such an implementation, where different dielectric layers have different $E_{bd}$ (assuming the layers have the same dielectric constant), the breakdown occurs first in the dielectric layer having the smallest breakdown field. The maximum breakdown voltage can be obtained by an approximate ratio of d1 to d2 that satisfies the relation, $$d1 * E1_{bd} = d2 * E2_{bd}.$$

where $E_{bd,1}$ is the breakdown field of dielectric layer above plate 214 having the weakest breakdown field, and $E2_{bd}$ is breakdown field of dielectric layer above plate 214 that has the weakest breakdown field.

In some applications, the silicon layer (e.g., 432) of a SOI substrate may be connected to a reference voltage (e.g., ground voltage). In order for the insulation buried oxide layer 434 to provide additional isolation between the capacitive plate 214 and the ground voltage, the portion of the silicon layer 432 below the capacitive plate 214 may be insulated from the ground voltage.

Figure 5:
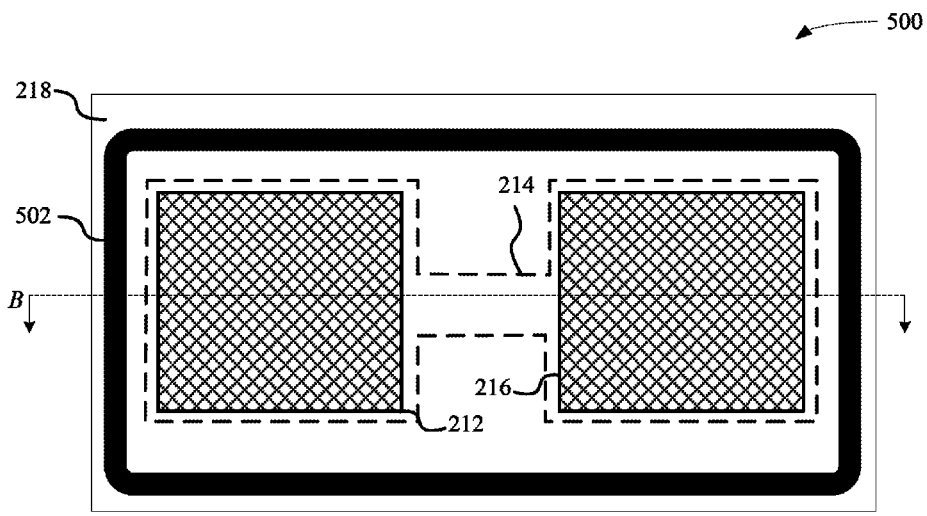
FIG. 5 shows a top view of the capacitive structure formed on a partially floating substrate, consistent with one or more embodiments of the present disclosure.
Figure 6:
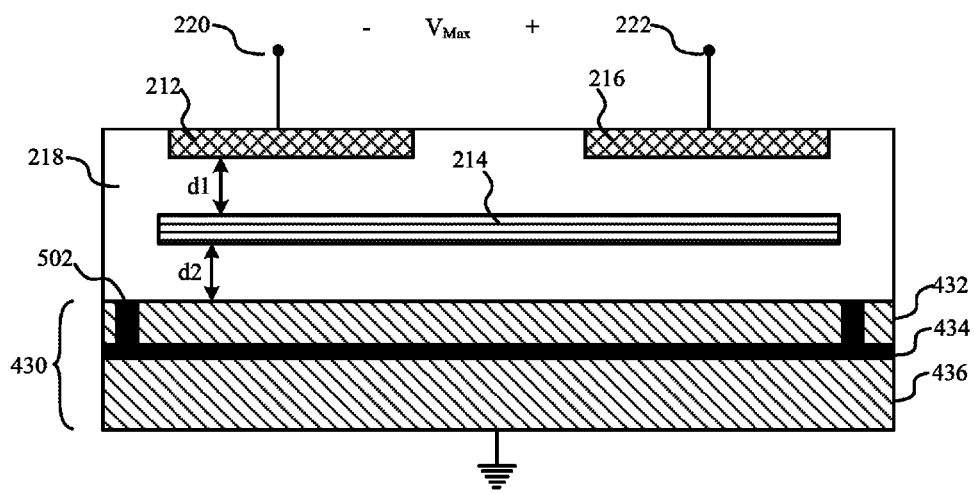
FIG. 6 shows a cross sectional view of the capacitive structure shown in FIG. 5, consistent with one or more embodiments of the present disclosure.

FIGS. 5 and 6 show a capacitive structure with an oxide ring 502 provided to insulate the portion of the silicon layer of the SOI substrate from the ground voltage. FIG. 5 shows a top view of the capacitive structure in accordance with one or more embodiments. In some embodiments, for instance, the capacitive structure 500 may be used, e.g., to implement capacitive structures 106 and 108 in FIG. 1. FIG. 6 shows a cross section B of the capacitive structure shown in FIG. 5, in accordance with one or more embodiments. The capacitive structure shown in FIGS. 5 and 6 is similar to the capacitive structure shown in FIGS. 2 and 4 in many respects. For ease of explanation, reference numbers of FIGS. 2 and 4 are used to describe similar aspects.

As a result of the oxide ring 502, the voltage of the insulated portion of the silicon layer is floating with respect to the ground voltage. The oxide ring 502 may be implemented in some embodiments using medium trench isolation (MTI). To fully utilize the isolation of the oxide layer 434, the breakdown strength of the oxide ring 502 should be greater than or equal to that of the oxide layer 434. In some implementations, the oxide ring 502 may be implemented using multiple concentric oxide rings.

Some applications may require breakdown voltages greater than those achieved by the above capacitive structures. It is recognized that multiple capacitive structures may be implemented on one or more substrates and connected together in series to increase the overall breakdown voltage. In such arrangements, the breakdown voltage between the endpoint contacts of the series coupled capacitive structures is equal to the sum of the individual breakdown voltages (V_Total$_{max}$) of the capacitive structures so connected.

Figure 7:
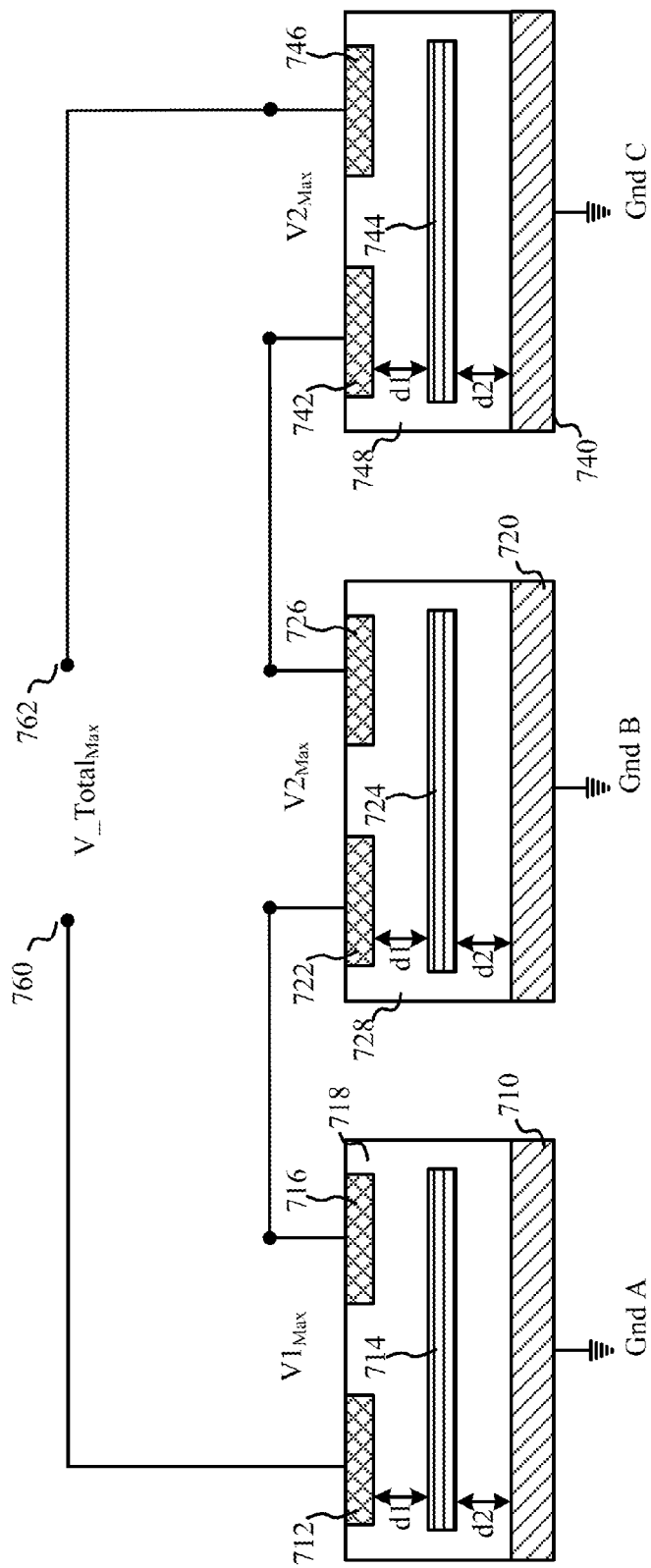
FIG. 7 shows a cross sectional view of the several series capacitive structures, consistent with one or more embodiments of the present disclosure.

FIG. 7 shows three series-connected capacitive structures located on separate substrates, consistent with one or more embodiments. In this example, the three capacitive structures are similar in structure and operation to the cross section of the capacitive structure 200 shown in FIG. 3. Substrates 710, 720, and 740 correspond to substrate 210, and dielectrics 718, 728, and 748 correspond to dielectric 218. Capacitive plates 712, 722, and 742 each correspond to capacitive plate 212 shown in FIG. 3. Likewise, capacitive plates 714, 724, and 744 each correspond to capacitive plate 214, and capacitive plates 716, 726, and 746 each correspond to capacitive plate 216.

The three capacitive structures are connected together in series to provide a series coupled capacitance. The connections between pads 716 and 722 can, for example, be made using bondwires. This can be particularly useful for providing a large breakdown voltage V_Total$_{max}$ between nodes 760 and 762, relative to a single capacitive structure (e.g., V1$_{max}$). By placing multiple capacitive structures in series, the effective breakdown voltage V_Total$_{max}$ is the sum of the individual breakdown voltages of the series coupled capacitive structures (e.g., V_Total$_{max}$=V1$_{max}$+V2$_{max}$+V3$_{max}$).

In some embodiments, the substrates 710,720 and 740 can be tied to a reference voltage, such as ground, as shown in FIG. 7. For instance, various types of digital circuitry can require, or otherwise benefit from, a grounded substrate. In other embodiments, one or more of the substrates 710,720 or 740 can be left at a floating voltage potential. For these floating substrates, breakdown voltage between the intermediate capacitive plate and the substrate may be less of a concern (e.g., due to the respective voltage differentials that may then occur between an intermediate plate and the substrate). For such applications, the overall breakdown voltage may be increased by increasing the dielectric thickness d1 relative to the dielectric thickness d2.

Figure 8:
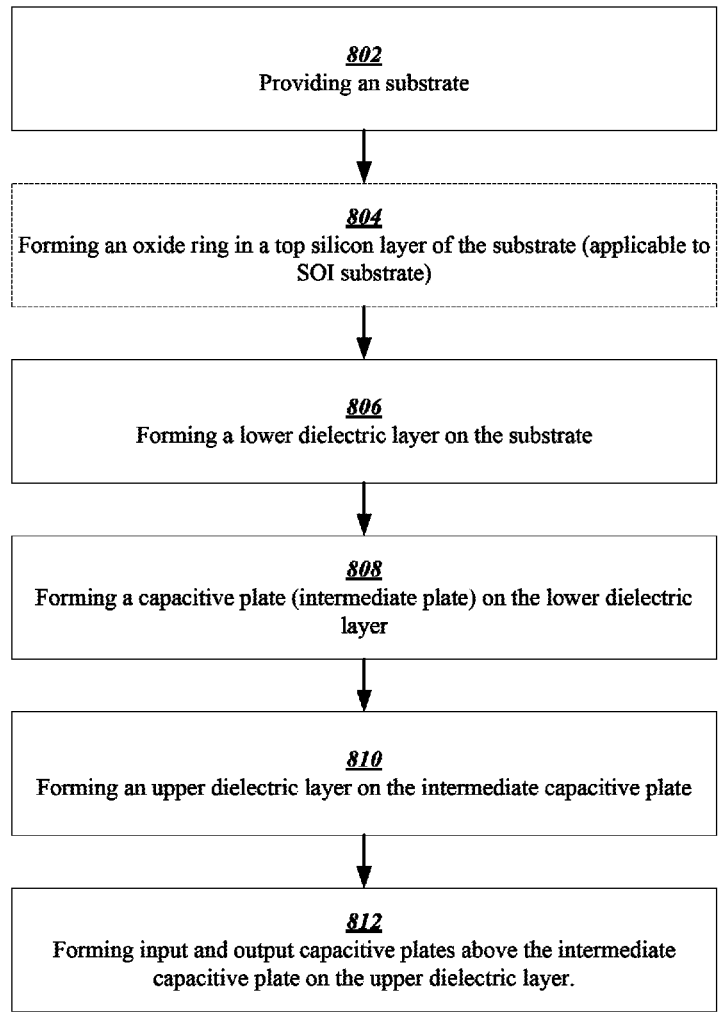
FIG. 8 shows a method of manufacturing a capacitive structure, consistent with one or more embodiments of the present disclosure.

FIG. 8 shows a method for manufacture of a capacitive structure consistent with one or more embodiments. An SOI substrate is provided at block 802. Optionally, in some embodiments, an isolation ring may be formed at block 804 by forming an oxide ring (e.g., 502) in a top silicon layer (e.g., 230) of the SOI substrate. For instance the oxide ring may be formed using medium trench isolation (MTI). As described with reference to FIGS. 5 and 6, the addition of the isolation trench can be used to insulate a portion of the silicon layer that is floating with respect to a ground voltage.

A lower dielectric layer (e.g., the dielectic layer having thickness d2) is formed over the SOI substrate at block 806. An intermediate capacitive plate is formed on the dielectric layer at block 808. An upper dielectric layer (e.g., the dielectric layer having thickness d1) is formed on the intermediate capacitive plate at block 810. Input and output capacitive plates (e.g., 212 and 216) are formed on the upper dielectric layer at block 812.

The lower dielectric layer separates the SOI substrate from the intermediate capacitive plate by a distance (e.g. d2) that influences the breakdown voltage between the capacitive plate and the SOI substrate. Similarly, the upper dielectric layer separates each of the input and output capacitive plates (e.g., 212 and 216) from the intermediate capacitive plate (e.g., 214) by a distance (e.g., d1) that influences the breakdown voltage between the intermediate capacitive plate and the input or output capacitive plates. As described with reference to FIGS. 2 and 3, the overall breakdown voltage of the capacitive structure is determined by the smaller of the two breakdown voltages through the respective first and second dielectric layers. One or more embodiments adjust the overall breakdown voltage by configuring the respective thicknesses d1 and d2 of the dielectric layers, such that the first and second breakdown voltages are (substantially) equal.

In certain embodiments, the breakdown voltages are substantially equal relative to the desired application. For instance, the breakdown voltages may vary depending upon the manufacturing processes. In such instances, the precise breakdown voltages can vary from device to device. The breakdown voltage, however, is still substantially equal despite such manufacturing variations. In another instance, minor differences in the breakdown voltages are possible such that the overall breakdown voltage of the device or structure is within an acceptable margin relative to having identical breakdown voltages (e.g., 5%).

Figure 9:
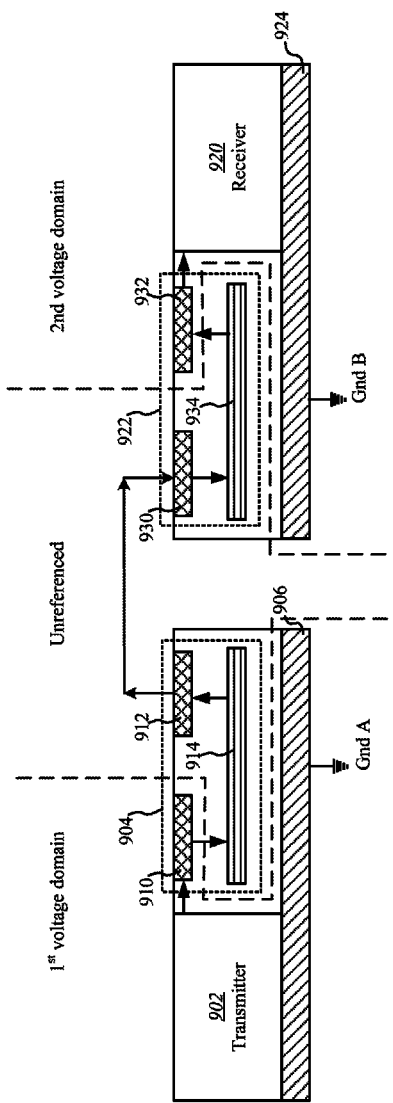
FIG. 9 illustrates a method of communication between first and second voltage domains, consistent with one or more embodiments of the present disclosure.

FIG. 9 illustrates a method of communication between first and second voltage domains, consistent with one or more embodiments. Communication signals are transmitted from a transmitter circuit 902 located on a first substrate 906 that is in a first voltage domain. Capacitive isolation is provided for the communication signals between the first voltage domain and a second voltage domain by communicating the transmitted communication signals through an isolation circuit that includes a first capacitive structure 904 located on the first substrate 906 to provide the communication signal from the first voltage domain to an unreferenced voltage domain. A second capacitive structure 922 located on a second substrate 924 is used to provide the communication signals from the unreferenced voltage domain to a second voltage domain. A receiver circuit 920 is located on the second substrate and is configured to receive the communication signals at an input in the second voltage domain from the second capacitive structure 922.

The capacitive structures 904 and 922 illustrated in FIG. 9 are each structurally and operationally similar to the capacitive structure discussed, for instance, with reference to FIGS. 2 and 3. For instance, capacitive structure 904 includes three capacitive plates 910, 912, and 914, which are configured and arranged in a similar manner as capacitive plates 212, 214, and 216. Likewise, capacitive structure 904 includes three capacitive plates 930, 934, and 932, which are configured and arranged in a similar manner as capacitive plates 212, 214, and 216.

Capacitive plate 910 is configured to receive the communication signals from the transmitter 902 in the first voltage domain. The communication signals are capacitively communicated (using capacitive coupling between plates of the capacitor) from the plate 910 to plate 914, which operates as a floating node in the unreferenced voltage domain. The communication signals are capacitively communicated from plate 914 to plate 912, which operates as a second floating node in the unreferenced voltage domain. The communication signals are passed from plate 912 to plate 930, which operates as a third floating node in the unreferenced voltage domain. The communication signals are capacitively communicated from the plate 912 to plate 930 with operates as a third floating node in the unreferenced voltage domain. The communication signals are capacitively communicated from the plate 930 to plate 934, which operates as a fourth floating node in the unreferenced voltage domain. The communication signals are capacitively communicated from the plate 934 to plate 932, which operates as in the second voltage domain. The receiver 920 is receives the communication signals in the second voltage domain from capacitive plate 932.

Certain embodiments are directed toward controlling the breakdown voltage by designing the different capacitive plates to have different sizes and/or shapes. For instance, it has been recognized that the electric field can be strongest near the edge of a capacitive plate and or at a corner of a capacitive plate. Accordingly, the breakdown voltage is sometimes limited by the electric field strength at such locations (where it is the strongest). Accordingly, embodiments contemplate offsetting the edges of the respective plates from one another (relative to a horizontal/lateral position). For instance, the intermediate (bottom) capacitive plate can be configured to extend beyond the edges of each of the input and output (upper) capacitive plates.

In certain instances, one or more embodiments can use different coding techniques and different types of circuits communicating data through the isolation region. The data communications can use analog, digital, RF, serial and/or parallel communication techniques. For certain high-speed applications, different types of modulation schemes can be used for carrying information across the isolation region, including but not limited to OOK (on-off keying), amplitude, phase-based and/or frequency-based. In some instances, communications can be carried out between multiple circuits placed within a single chip-package (e.g., BGA package) and also having galvanic isolation there between. In other instances, the communications can be carried out between multi-chip modules (MCM) having multiple integrated circuits (ICs), semiconductor dies or other discrete components contained within a common housing. In some instances, part of the signals reaching the receiver can be used for powering the IC, or waking it up out of a low-power mode.

The various communications can be carried out using different isolation buffer circuits and amplifiers. Various applications are also contemplated, including but not limited to applications in which small voltage differences exist between transmitters and receivers, and applications in which large voltages can exist (e.g., hundreds of volts as can be used in automotive applications where electric motors are used in place of (or in combination with) combustion engines). Consistent with one or more embodiments discussed herein, U.S. Pat. No. 6,920,576 (filed May, 31, 2001; Ehmann, Gregory E.), U.S. Pat. No. 6,882,046 (filed Dec. 18, 2001; Davenport, et al.) and "Signal Isolation Buffer Amplifiers" Burr-Brown, ISO102, ISO106, January 1995, each describe useful technical details, applications and various background information, and each of these documents is fully incorporated herein by reference.

The embodiments are thought to be applicable to a variety of applications using galvanic isolation. Other aspects and embodiments will be apparent to those skilled in the art from consideration of the specification. While the present disclosure is amenable to various modifications and alternative forms, specifics thereof have been shown by way of example in the drawings and will be described in further detail. It should be understood that the intention is not to limit the disclosure to the particular embodiments and/or applications described. On the contrary, the intention is to cover all modifications, equivalents, and alternatives falling within the spirit and scope of the present disclosure.

What is claimed is:

1. A device, comprising:
   a substrate;
   a dielectric layer over the substrate;

a lower capacitor plate in the dielectric layer, wherein the lower capacitor layer is parallel to a surface of the substrate and is located at a first distance from the surface of the substrate;

two upper capacitor plates in the dielectric layer over and at a second distance from the lower capacitor plate, wherein the two upper capacitor plates combined substantially overlap the lower capacitor plate and wherein the two upper capacitor plates do not touch each other;

wherein the first distance and the second distance are preselected based on a breakdown voltage of a material of the dielectric layer.

2. The device of claim 1, wherein the lower capacitor plate and the two upper capacitor plates are configured to form two capacitors connected in series.

3. The device of claim 1, wherein the two upper capacitor plates do not touch the lower capacitor plate.

4. The device of claim 1, wherein the lower capacitor plate is configured to be connected to a power terminal.

5. The device of claim 4, wherein the two upper capacitor plates are configured to be connected to power terminals that are of opposite polarity of the power terminal that the lower capacitor plate is configured to be connected to.

6. The device of claim 1, wherein the first distance and the second distance are further preselected based on a maximum voltage for which the device is designed to be used with.

7. The device of claim 1, wherein the substrate includes a handle wafer and a silicon layer.

8. The device of claim 7, wherein a buried oxide layer is included to isolate the handle wafer from the silicon layer.

9. The device of claim 8, wherein an oxide ring protruding from the buried oxide layer isolates a portion of the silicon layer of the substrate from other portions of the silicon layer.

10. The device of claim 9, wherein the portion of the silicon layer that is isolated by the oxide ring lies immediately under the lower capacitor plate and the portion of the silicon layer is bigger in area than the area of the lower capacitor plate such that the lower capacitor plate does not protrude out of the portion of the silicon layer on a horizontal plane.

11. A communication device fabricated on a substrate, comprising:

a transmitter fabricated in a first voltage domain;

a receiver fabricated in a second voltage domain; wherein the transmitter is separated from the receiver through a unreferenced voltage domain, wherein the receiver including a capacitive device, the device comprising:

a dielectric layer over the substrate;

a lower capacitor plate in the dielectric layer, wherein the lower capacitor layer is parallel to a surface of the substrate and is located at a first distance from the surface of the substrate;

two upper capacitor plates in the dielectric layer over and at a second distance from the lower capacitor plate, wherein the two upper capacitor plates combined substantially overlap the lower capacitor plate and wherein the two upper capacitor plates do not touch each other;

wherein the first distance and the second distance are preselected based on a breakdown voltage of a material of the dielectric layer.

12. The communication device of claim 11, wherein the lower capacitor plate and the two upper capacitor plates are configured to form two capacitors connected in series.

13. The communication device of claim 11, wherein the two upper capacitor plates do not touch the lower capacitor plate.

14. The communication device of claim 11, wherein the lower capacitor plate is configured to be connected to a power terminal.

15. The communication device of claim 14, wherein the two upper capacitor plates are configured to be connected to power terminals that are of opposite polarity of the power terminal that the lower capacitor plate is configured to be connected to.

16. The communication device of claim 11, wherein the first distance and the second distance are further preselected based on a maximum voltage for which the device is designed to be used with.

17. The communication device of claim 11, wherein the substrate includes a handle wafer and a silicon layer.

18. The communication device of claim 17, wherein a buried oxide layer is included to isolate the handle wafer from the silicon layer.

19. The communication device of claim 18, wherein an oxide ring protruding from the buried oxide layer isolates a portion of the silicon layer of the substrate from other portions of the silicon layer.

20. The communication device of claim 19, wherein the portion of the silicon layer that is isolated by the oxide ring lies immediately under the lower capacitor plate and the portion of the silicon layer is bigger in area than the area of the lower capacitor plate such that the lower capacitor plate does not protrude out of the portion of the silicon layer on a horizontal plane.

* * * * *